US010957691B2

(12) United States Patent
Kamibaba et al.

(10) Patent No.: US 10,957,691 B2
(45) Date of Patent: Mar. 23, 2021

(54) SEMICONDUCTOR DEVICE, SEMICONDUCTOR DEVICE MANUFACTURING METHOD, AND POWER CONVERSION APPARATUS

(71) Applicant: Mitsubishi Electric Corporation, Tokyo (JP)

(72) Inventors: Ryu Kamibaba, Tokyo (JP); Masayoshi Tarutani, Tokyo (JP); Shinya Soneda, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/736,494

(22) Filed: Jan. 7, 2020

(65) Prior Publication Data

US 2020/0144250 A1  May 7, 2020

Related U.S. Application Data

(62) Division of application No. 15/836,949, filed on Dec. 11, 2017, now Pat. No. 10,600,779.

(30) Foreign Application Priority Data

Apr. 6, 2017 (JP) ................... 2017-075726

(51) Int. Cl.
*H01L 27/06* (2006.01)
*H01L 29/08* (2006.01)
(Continued)

(52) U.S. Cl.
CPC .... *H01L 27/0664* (2013.01); *H01L 21/76805* (2013.01); *H01L 21/76843* (2013.01);
(Continued)

(58) Field of Classification Search
CPC ..... H01L 2924/00014; H01L 2924/013; H01L 2924/00; H01L 29/7397; H01L 29/1095
See application file for complete search history.

(56) References Cited

U.S. PATENT DOCUMENTS 7,999,314 B2  8/2011  Tsuzuki et al.
8,841,699 B2  9/2014  Tsuzuki et al.
(Continued)

FOREIGN PATENT DOCUMENTS

JP  2005-276978 A  10/2005
JP  2009-027152 A   2/2009
(Continued)

OTHER PUBLICATIONS

An Office Action; "Notification of Reasons for Refusal," mailed by the Japanese Patent Office dated Jun. 30, 2020, which corresponds to Japanese Patent Application No. 2017-075726 and is related to U.S. Appl. No. 16/736,494 with English language translation.
(Continued)

Primary Examiner — Tony Tran
(74) Attorney, Agent, or Firm — Studebaker & Brackett PC

(57) ABSTRACT

An RC-IGBT includes a first electrode disposed on a first main surface of a semiconductor substrate over a transistor region and a diode region. The semiconductor substrate includes a MOS gate structure on a first main surface side in the transistor region. The RC-IGBT includes: an interlayer dielectric covering a gate electrode of the MOS gate structure, and having a contact hole exposing a semiconductor layer; and a barrier metal disposed in the contact hole. The first electrode enters the contact hole, is in contact with the semiconductor layer of the MOS gate structure through the barrier metal, and is in direct contact with a semiconductor layer in the diode region of the semiconductor substrate.

3 Claims, 9 Drawing Sheets

(51) Int. Cl.

| | | |
|---|---|---|
| *H01L 29/40* | (2006.01) | |
| *H01L 27/07* | (2006.01) | |
| *H01L 29/36* | (2006.01) | |
| *H01L 29/417* | (2006.01) | |
| *H01L 21/768* | (2006.01) | |
| *H01L 23/532* | (2006.01) | |
| *H01L 23/535* | (2006.01) | |
| *H01L 29/45* | (2006.01) | |
| *H01L 29/66* | (2006.01) | |
| *H01L 29/739* | (2006.01) | |
| *H01L 29/861* | (2006.01) | |
| *H02M 7/5387* | (2007.01) | |
| *H02P 27/06* | (2006.01) | |

(52) U.S. Cl.
CPC .. *H01L 21/76889* (2013.01); *H01L 21/76895* (2013.01); *H01L 23/535* (2013.01); *H01L 23/53266* (2013.01); *H01L 27/0727* (2013.01); *H01L 29/0834* (2013.01); *H01L 29/36* (2013.01); *H01L 29/401* (2013.01); *H01L 29/407* (2013.01); *H01L 29/417* (2013.01); *H01L 29/456* (2013.01); *H01L 29/66136* (2013.01); *H01L 29/66348* (2013.01); *H01L 29/7397* (2013.01); *H01L 29/8613* (2013.01); *H02M 7/5387* (2013.01); *H02P 27/06* (2013.01); *Y02E 10/56* (2013.01)

(56) References Cited

U.S. PATENT DOCUMENTS

| | | | |
|---|---|---|---|
| 9,536,875 | B2 | 1/2017 | Tamura et al. |
| 2015/0255544 | A1 | 9/2015 | Uchida et al. |
| 2016/0163654 | A1 | 6/2016 | Nakanishi |
| 2017/0047322 | A1 | 2/2017 | Yoshida et al. |

FOREIGN PATENT DOCUMENTS

| | | | |
|---|---|---|---|
| JP | 2014-086431 | A | 5/2014 |
| JP | 2014-192351 | A | 10/2014 |
| JP | 2015-106695 | A | 6/2015 |
| JP | 2015-188066 | A | 10/2015 |
| JP | 2016-111110 | A | 6/2016 |
| JP | 5937413 | B2 | 6/2016 |
| WO | 2016/080269 | A1 | 5/2016 |

OTHER PUBLICATIONS

An Office Action; "Notification of Reasons for Refusal," mailed by the Japanese Patent Office dated Mar. 31, 2020, which corresponds to Japanese Patent Application No. 2017-075726 and is related to U.S. Appl. No. 16/736,494 with English language translation.

An Office Action; "Decision of Refusal", mailed by the Japanese Patent Office dated Dec. 8, 2020, which corresponds to Japanese Patent Application No. 2017-075726 and is related to U.S. Appl. No. 16/736,494 with English language translation.

An Office Action; "Decision of Dismissal of Amendment", mailed by the Japanese Patent Office dated Dec. 8, 2020, which corresponds to Japanese Patent Application No. 2017-075726 and is related to U.S. Appl. No. 16/736,494 with English language translation.

SEMICONDUCTOR DEVICE, SEMICONDUCTOR DEVICE MANUFACTURING METHOD, AND POWER CONVERSION APPARATUS

CROSS-REFERENCE TO RELATED APPLICATIONS

This application is a Divisional of U.S. patent application Ser. No. 15/836,949 filed on Dec. 11, 2017, which claims benefit of priority to Japanese Patent Application No. 2017-075726 filed Apr. 6, 2017, the entire content of which is incorporated herein by reference.

BACKGROUND OF THE INVENTION

Field of the Invention

The present invention relates to a semiconductor device, a semiconductor device manufacturing method, and a power conversion apparatus.

Description of the Background Art

An inverter apparatus having been used in a wide range of fields, such as consumer electronics, electric vehicles, and railways, often drives an inductive load, such as an induction motor. The inverter apparatus includes a plurality of power semiconductor devices including a switching element, such as an insulated gate bipolar transistor (IGBT) and a metal-oxide-semiconductor field-effect transistor (MOSFET), and a freewheeling diode (hereinafter, simply referred to as a "diode"). The inverter apparatus is required to be highly efficient and low power, and thus there is a demand in the marketplace for high-performance low-cost power semiconductor devices.

To achieve high-performance low-cost power semiconductor devices, a trench MOS gate structure, a thinner semiconductor substrate, a reverse conducting IGBT (RC-IGBT) including an IGBT and a diode built in the same semiconductor substrate for integration, and the like have been developed.

The prior air documents concerning the RC-IGBT include Japanese Unexamined Patent Application Publication No. 2009-027152, Japanese Patent No. 5937413, WO 2016/080269, and Japanese Unexamined Patent Application Publication No. 2015-106695, for example. Japanese Unexamined Patent Application Publication No. 2009-027152 discloses a semiconductor device including a MOS transistor cell and a diode cell. The semiconductor device disclosed in Japanese Unexamined Patent Application Publication No. 2009-027152 has a first trench and a second trench. A gate dielectric and a gate electrode are formed in the first trench, and an emitter electrode is embedded in the second trench.

Japanese Patent No. 5937413 discloses that the width of a contact hole is larger in a diode operating region than in an IGBT operating region of an RC-IGBT.

WO 2016/080269 proposes that aluminum silicon of an emitter electrode and a semiconductor substrate be connected through a barrier metal and a tungsten plug in an IGBT region, and be directly connected in a diode region.

Japanese Unexamined Patent Application Publication No. 2015-106695 discloses configuration in which an anode layer and an aluminum electrode are directly connected not through a tungsten plug in a diode region. A first electrode in the diode region, however, is a barrier metal, such as titanium (Ti), titanium tungsten (TiW), and titanium nitride (TiN), whereas a first electrode in an IGBT region is aluminum. Use of the different materials causes a problem in an assembly process using semiconductor devices. For example, wire bonding is required to be performed under different conditions. In addition, due to the need for a process of forming and removing aluminum before formation of the barrier metal in the IGBT region in a manufacturing method, the spread of aluminum into a base layer or etching damage to the base layer might be caused.

A conventional RC-IGBT includes, in an IGBT region, a structure in which a semiconductor substrate, a barrier metal, a tungsten plug, and a surface electrode are stacked. This structure is a structure typically included in an IGBT, and is also provided in a diode region on the same semiconductor substrate. In the diode region, however, contact resistance between a p-type anode layer and the barrier metal is high, and, to address this problem, a p+-type anode layer having a high concentration is disposed between the p-type anode layer and the barrier metal.

A higher impurity concentration of the p+-type anode layer, however, leads to larger supply of carriers in an on state of operation, causing a significant delay in discharge of carriers in an off state of operation.

WO 2016/080269 solves the above-mentioned problem by using the barrier metal and the tungsten plug only in the IGBT region, and directly connecting the aluminum silicon and the p-type anode layer in the diode region. Use of the tungsten plug in the IGBT region, however, increases the manufacturing cost.

Japanese Unexamined Patent Application Publication No. 2015-106695 does not use the tungsten plug in the IGBT region, but uses surface electrodes of different materials in the IGBT region and in the diode region. This requires application of different process conditions, such as a change in wire bonding condition in the IGBT region and in the diode region, in the assembly process using the semiconductor devices.

SUMMARY

It is an object of the present invention to achieve favorable diode characteristics and low cost of a semiconductor device including a switching element region and a diode region on the same semiconductor substrate.

A semiconductor device according to the present invention includes a semiconductor substrate, a first electrode, an interlayer dielectric, and a barrier metal. The semiconductor substrate has a first main surface and a second main surface, and includes a transistor region and a diode region. The transistor region forms a transistor extending from the first main surface to the second main surface. The diode region forms a diode extending from the first main surface and the second main surface. The first electrode is disposed on the first main surface of the semiconductor substrate over the transistor region and the diode region. The semiconductor substrate includes a MOS gate structure on a first main surface side in the transistor region. The interlayer dielectric covers a gate electrode of the MOS gate structure, and has a contact hole. The contact hole exposes a semiconductor layer of the MOS gate structure. The barrier metal is disposed in the contact hole. The first electrode enters the contact hole, is in contact with the semiconductor layer of the MOS gate structure through the barrier metal in the contact hole, and is in direct contact with a semiconductor layer in the diode region of the semiconductor substrate.

In the semiconductor device according to the present invention, the semiconductor layer of the MOS gate structure is in contact with the first electrode through the barrier metal, whereas the semiconductor layer in the diode region is in contact with the first electrode not through the barrier metal. This eliminates the need to provide a high concentration anode layer in the diode region to reduce contact resistance, and favorable diode characteristics can be obtained. As the first electrode enters the contact hole, and is in contact with the semiconductor layer of the MOS gate structure, there is no need to use an expensive contact plug, such as a tungsten plug, and the semiconductor device can be manufactured at a low cost.

These and other objects, features, aspects and advantages of the present invention will become more apparent from the following detailed description of the present invention when taken in conjunction with the accompanying drawings.

DESCRIPTION OF THE PREFERRED EMBODIMENTS

Embodiments will be described below with reference to the accompanying drawings. The drawings are schematic diagrams, and thus the sizes and the correlations between locations of images illustrated in different drawings are not necessarily correct, and can be changed appropriately. In the following description, similar components bear the same reference signs for illustration, and have similar names and functions. Detailed description thereof is thus sometimes omitted.

In the following description, terms meaning specific locations and directions, such as "upper", "lower", "side", "bottom", "front", and "back", may be used, but these terms are used for convenience sake to facilitate understanding of embodiments, and do not limit the directions in actual use.

As for the conductivity type of a semiconductor, description will be made by defining a first conductivity type as an n-type and a second conductivity type as a p-type. The conductivity type, however, may be reversed by defining the first conductivity type as the p-type and the second conductivity type as the n-type. An n+-type means a conductivity type having a higher impurity concentration than the n-type, and an n--type means a conductivity type having a lower impurity concentration than the n-type. Similarly, a p+-type means a conductivity type having a higher impurity concentration than the p-type, and a p--type means a conductivity type having a lower impurity concentration than the p-type.

A. Underlying Technology

Figure 1:
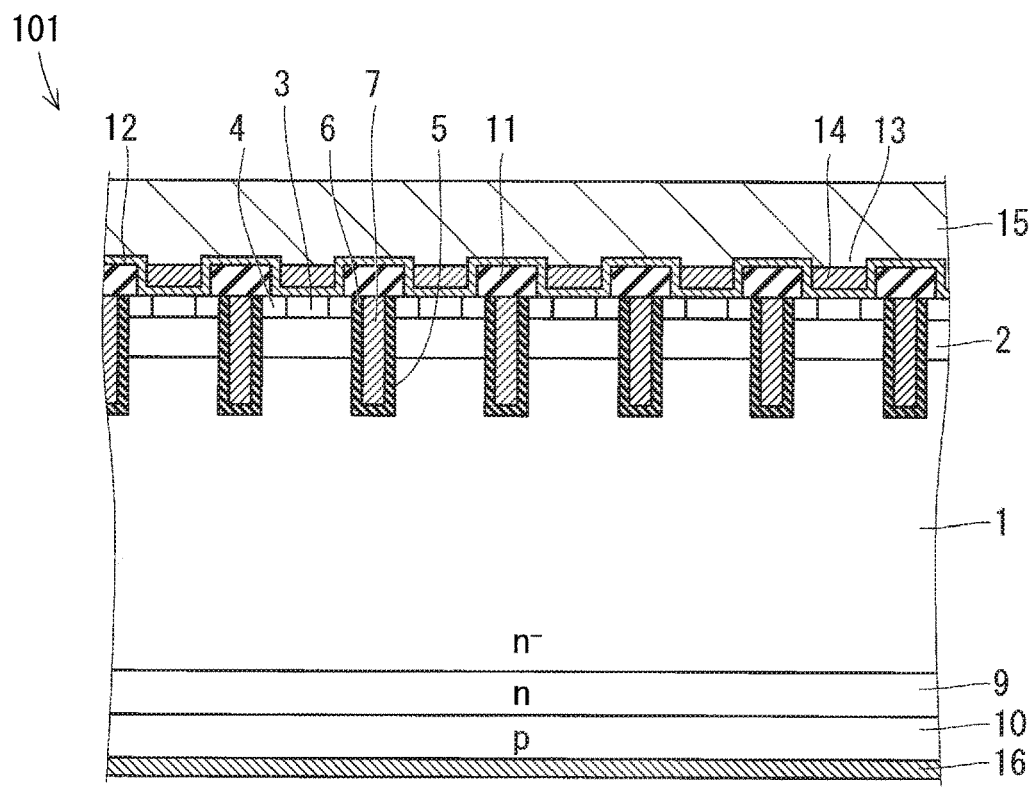
FIG. 1 is a sectional view of an IGBT according to underlying technology of the present invention.

As technology underlying the present invention, the configuration of each of a trench gate IGBT, a diode, and an RC-IGBT will be described. The trench gate IGBT will be described first. FIG. 1 is a sectional view of a trench gate IGBT 101. The IGBT 101 includes an n--type drift layer 1, a p-type base layer 2, an n-type buffer layer 9, an n+-type emitter layer 4, a gate dielectric 6, a gate electrode 7, a p-type collector layer 10, a p+-type base layer 3, an emitter electrode 15, a barrier metal 12, a tungsten plug 14, and a collector electrode 16.

The p-type base layer 2 is disposed on an upper surface of the n--type drift layer 1. The n+-type emitter layer 4 and the p+-type base layer 3 are selectively disposed on an upper surface of the p-type base layer 2. The n+-type emitter layer 4 is disposed to surround the p+-type base layer 3. The n-type buffer layer 9 and the p-type collector layer 10 are disposed in the stated order on a lower surface of the n--type drift layer 1. The collector electrode 16 is disposed on a lower surface of the p-type collector layer 10.

A plurality of trenches 5 are formed to penetrate, from an upper surface of the n+-type emitter layer 4, the n+-type emitter layer 4 and the p-type base layer 2 to reach the n--type drift layer 1. The gate dielectric 6 and the gate electrode 7 are embedded in an inner wall of each of the trenches 5. The gate electrode 7 faces the p-type base layer 2 with the gate dielectric 6 therebetween.

The IGBT 101 includes a trench MOS gate structure to increase channel density, and has the n--type drift layer 1 having a reduced thickness to achieve low loss. When the n--type drift layer 1 has a reduced thickness, it is required to dispose a stopper to stop extension of a depletion layer from a p-n junction between the p-type base layer 2 and the n--type drift layer 1 at the time of switching off, and thus the n-type buffer layer 9 having a higher impurity concentration than the n--type drift layer 1 is disposed as the stopper. The presence or absence of the n-type buffer layer 9 is determined by a product application, and, depending on the product application, the n-type buffer layer 9 is not disposed.

When the IGBT 101 is on, the p-type base layer 2, the n+-type emitter layer 4, the gate dielectric 6, and the gate electrode 7 form an n channel MOSFET, and current flows through the p-type collector layer 10, the n-type buffer layer 9, the n--type drift layer 1, the p-type base layer 2, and the n+-type emitter layer 4. That is to say, the p-type base layer 2, the n+-type emitter layer 4, the gate dielectric 6, and the gate electrode 7 constitute a transistor structure.

An upper surface of the gate electrode 7 is covered with the interlayer dielectric 11 to achieve insulation of the gate electrode 7 from the emitter electrode 15. The interlayer dielectric 11 has a contact hole 13 exposing the p+-type base layer 3 and the n+-type emitter layer 4. The p+-type base layer 3 has the effect of sweeping out carriers generated at the time of switching off, and reducing the contact resistance to the emitter electrode 15.

The barrier metal 12 is disposed on the interlayer dielectric 11 and on an inner wall of the contact hole 13. The barrier metal 12 is in contact with an upper surface of the p+-type base layer 3 and the upper surface of the n+-type emitter layer 4 in the contact hole 13. The tungsten plug 14 is embedded in the contact hole 13 to be disposed on the barrier metal 12. The tungsten plug 14 is used to achieve finer design rules.

The barrier metal 12 is silicided upon coming into contact with a silicon semiconductor substrate, and has the effect of reducing the contact resistance to the n+-type emitter layer 4 and the p+-type base layer 3. The barrier metal 12 also has the effect of preventing chemical etching caused by a reaction of a WF6 gas used in forming the tungsten plug 14 to the silicon semiconductor substrate. When the tungsten plug 14 is used in the contact hole 13, the barrier metal 12 typically has a multilayer structure of transition metals, such as titanium and titanium nitride, to obtain the above-mentioned effects.

The emitter electrode 15 is disposed on the barrier metal 12 and on the tungsten plug 14. An aluminum alloy is typically used as the emitter electrode 15. The emitter electrode 15 is connected to the n+-type emitter layer 4 and the p+-type base layer 3 through the barrier metal 12 and the tungsten plug 14. The foregoing is illustrative of the configuration of the IGBT 101.

Figure 2:
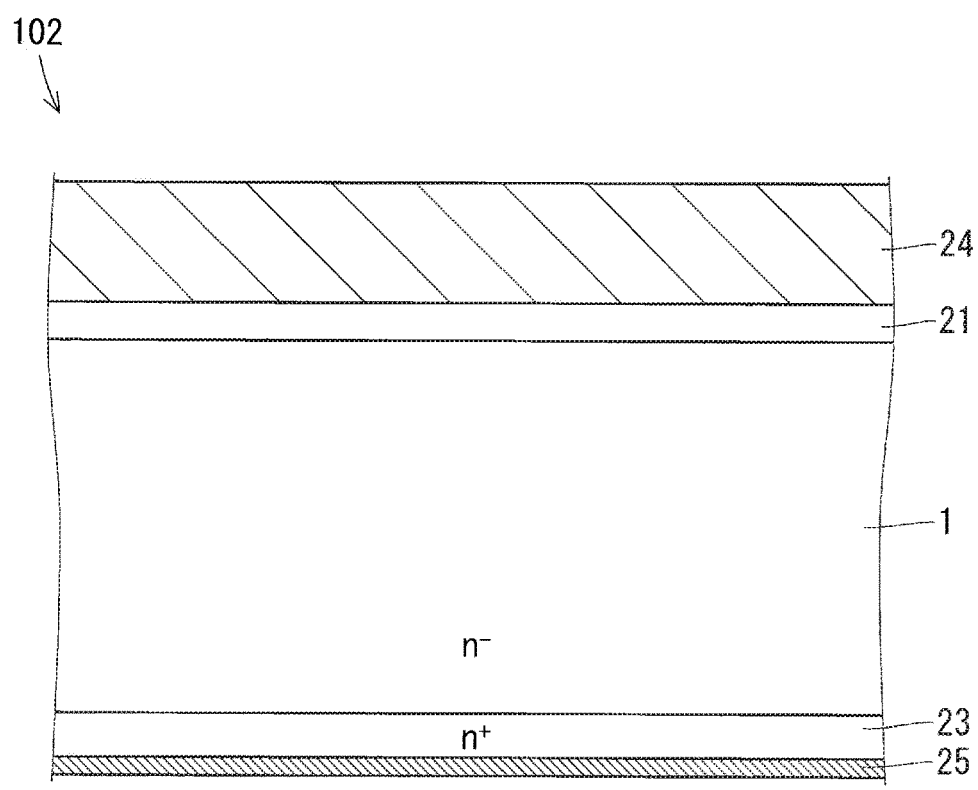
FIG. 2 is a sectional view of a diode according to the underlying technology of the present invention.

The configuration of the diode will be described next. FIG. 2 is a sectional view of a diode 102. The diode 102 has a structure in which a cathode electrode 25, an n+-type cathode layer 23, an n--type drift layer 1, a p-type anode layer 21, and an anode electrode 24 are stacked in the stated order.

An aluminum alloy forming a favorable ohmic contact with a p-type diffusion layer is typically used as the anode electrode 24.

When the diode 102 is on, current flows through the p-type anode layer 21, the n--type drift layer 1, and the n+-type cathode layer 23. That is to say, the p-type anode layer 21 and the n--type drift layer 1 constitute a diode structure.

Figure 3:
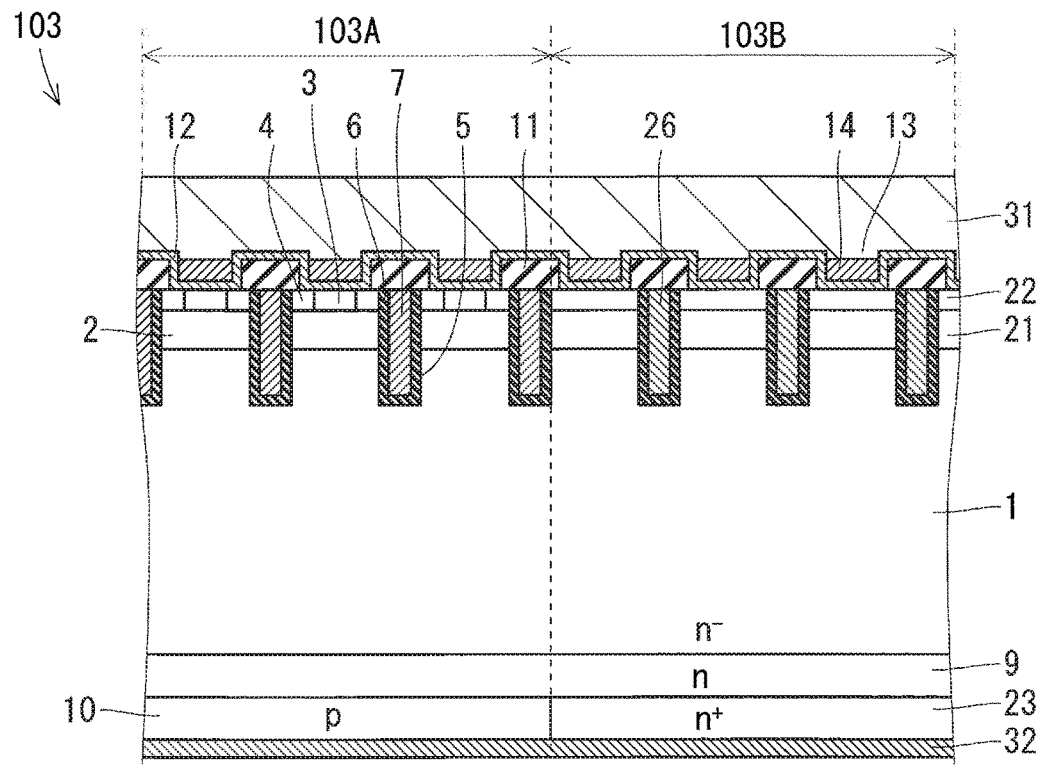
FIG. 3 is a sectional view of an RC-IGBT according to the underlying technology of the present invention.

The configuration of the RC-IGBT will be described next. FIG. 3 is a sectional view of an RC-IGBT 103. The RC-IGBT 103 has configuration in which the IGBT and the diode are built in the same semiconductor substrate, and includes an IGBT region 103A in which the IGBT is built and a diode region 103B in which the diode is built. A plurality of IGBT cells are collectively formed in the IGBT region 103A, and a plurality of diode cells are collectively formed in the diode region 103B.

The RC-IGBT 103 includes, in the IGBT region 103A, the n--type drift layer 1, the p-type base layer 2, the p+-type base layer 3, the n+-type emitter layer 4, the gate dielectric 6, the gate electrode 7, the n-type buffer layer 9, the p-type collector layer 10, the barrier metal 12, the tungsten plug 14, and the interlayer dielectric 11. This configuration is similar to that of the IGBT 101 illustrated in FIG. 1.

In the IGBT region 103A, the p+-type base layer 3 and the n+-type emitter layer 4 are connected to a first electrode 31 through the barrier metal 12 and the tungsten plug 14. The first electrode 31 is shared between the IGBT region 103A and the diode region 103B, and functions as an emitter electrode in the IGBT region 103A and as an anode electrode in the diode region 103B. An aluminum alloy is typically used as the first electrode 31.

In the IGBT region 103A, a second electrode 32 is disposed on a lower surface of the p-type collector layer 10. The second electrode 32 is formed also in the diode region 103B, and is shared between the IGBT region 103A and the diode region 103B. The second electrode 32 functions as a collector electrode in the IGBT region 103A and as a cathode electrode in the diode region 103B. An aluminum alloy is typically used as the second electrode 32.

The RC-IGBT 103 includes, in the diode region 103B, the n--type drift layer 1, the p-type anode layer 21, and the n+-type cathode layer 23. This configuration is similar to that of the diode 102 illustrated in FIG. 2. The RC-IGBT 103 further includes, in the diode region 103B, the n-type buffer layer 9 disposed between the n--type drift layer 1 and the n+-type cathode layer 23, and a p+-type anode layer 22 disposed on the p-type anode layer 21. The n--type drift layer 1 and the n-type buffer layer 9 are commonly used in the IGBT region 103A and in the diode region 103B.

In the diode region 103B, the trenches 5 are formed to penetrate, from an upper surface of the p+-type anode layer 22, the p+-type anode layer 22 and the p-type anode layer 21 to reach the n--type drift layer 1. The gate dielectric 6 and a dummy gate electrode 26 are disposed on an inner wall of each of the trenches 5. The dummy gate electrode 26 is typically floated or grounded to the first electrode 31.

The interlayer dielectric 11, the barrier metal 12, and the tungsten plug 14 are also disposed in the diode region 103B, as in the IGBT region 103A. This means that the first electrode 31 is in contact with the p+-type anode layer 22 through the tungsten plug 14 and the barrier metal 12 in the diode region 103B. The p+-type anode layer 22, which has a high concentration, is herein used to effectively reduce the contact resistance, because ohmic property is poor and the contact resistance is high if the barrier metal 12 and the p-type anode layer 21 are in direct contact with each other.

The foregoing is illustrative of the configuration of the RC-IGBT 103. As described above, the p+-type anode layer 22, which has a high concentration, is disposed in the diode region 103B of the RC-IGBT 103 to reduce the contact resistance to the barrier metal 12. A higher impurity concentration of the p+-type anode layer 22, however, leads to larger supply of carriers when the diode is on, causing a delay in discharge of carriers when the diode is off.

B. Embodiment 1

In Embodiment 1 of the present invention, the barrier metal is not disposed in the diode region of the RC-IGBT to solve the above-mentioned problem.

B-1. Configuration

Figure 4:
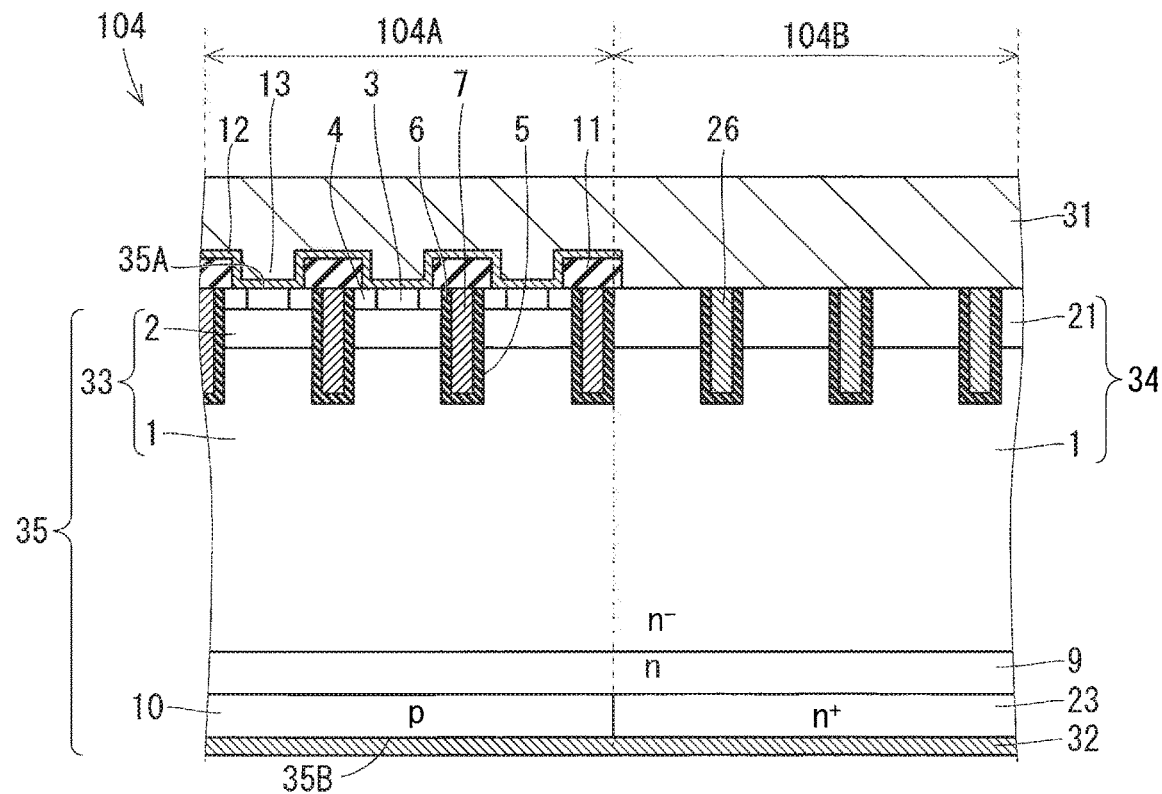
FIG. 4 is a sectional view of an RC-IGBT according to the present invention.

FIG. 4 is a sectional view of an RC-IGBT 104 as a semiconductor device according to Embodiment 1 of the present invention. The RC-IGBT 104 includes an IGBT and a diode built in the same semiconductor substrate. A region of the RC-IGBT 104 in which the transistor is built is referred to as a transistor region 104A, and a region of the RC-IGBT 104 in which the diode is built is referred to as a diode region 104B. As the semiconductor substrate, a semiconductor substrate including silicon (Si), for example, is herein used.

Compared with the configuration of the RC-IGBT 103 described in the underlying technology, the RC-IGBT 104 does not include the tungsten plug in the transistor region 104A and in the diode region 104B, and, further, does not include the p+-type anode layer 22, the interlayer dielectric 11, and the barrier metal 12 in the diode region 104B. In the transistor region 104A of the RC-IGBT 104, not the tungsten plug 14 but the first electrode 31 is embedded in the contact hole 13 of the interlayer dielectric 11. In the diode region 104B of the RC-IGBT 104, the p-type anode layer 21 and the first electrode 31 are in direct contact with each other. The configuration of the RC-IGBT 104 other than the above-mentioned configuration is not described as it is similar to that of the RC-IGBT 103.

In the transistor region 104A of the RC-IGBT 104, the n−-type drift layer 1, the p-type base layer 2, the p+-type base layer 3, the n+-type emitter layer 4, the gate dielectric 6, and the gate electrode 7 constitute a MOS gate structure 33. In the diode region 104B of the RC-IGBT 104, the n−-type drift layer 1 and the p-type anode layer 21 constitute a diode structure 34 having a p-n junction. In the present specification, the structure composed of the MOS gate structure 33, the diode structure 34, the n-type buffer layer 9, the p-type collector layer 10, and the n+-type cathode layer 23 is referred to as a semiconductor substrate 35. An upper surface and a lower surface of the semiconductor substrate 35 in the plane of FIG. 4 are respectively referred to as a first main surface 35A and a second main surface 35B.

This means that the RC-IGBT 104 includes the MOS gate structure 33 on the first main surface 35A side of the semiconductor substrate 35 in the transistor region 104A.

The semiconductor substrate 35 includes the p-type collector layer 10 on the second main surface 35B side in the transistor region 104A, and the transistor region 104A forms an IGBT.

In the RC-IGBT 104, the plurality of trenches 5 are formed in the depth direction (the vertical direction of FIG. 4) from the first main surface 35A of the semiconductor substrate 35. In FIG. 4, the trenches 5 are formed in each of the transistor region 104A and the diode region 104B, but the trenches 5 may not be formed in the diode region 104B. Although a backward direction (a direction perpendicular to the plane of FIG. 4) of each of the trenches 5 is not limited, the trenches 5 are formed to have the same backward direction. In the example of FIG. 4, all the trenches 5 have the same backward direction in each of the transistor region 104A and the diode region 104B.

In the transistor region 104A, an n-type carrier stored (CS) layer may be disposed under the p-type base layer 2.

In the diode region 104B, the p-type anode layer 21 surrounded by the trenches 5 is disposed on the first main surface 35A side of the semiconductor substrate 35. The impurity concentration of the p-type anode layer 21 is determined so that a desired forward voltage can be obtained.

FIG. 4 illustrates a case where the dummy gate electrode 26 in the diode region 104B is not covered with the interlayer dielectric 11, but the dummy gate electrode 26 may be covered with the interlayer dielectric 13.

Titanium being the transition metal is used as the barrier metal 12, for example. The barrier metal 12 is silicided at an interface with the semiconductor substrate for the purpose of reducing the contact resistance to the n+-type emitter layer 4. The barrier metal includes titanium nitride, titanium carbide, or titanium silicide.

An aluminum alloy, such as Al—Si, Al—Cu, and Al—Si—Cu, is used as the first electrode 31. The content of components other than aluminum in the aluminum alloy is preferably 0.1% or more to reduce interdiffusion to the silicon semiconductor substrate.

Figure 5:
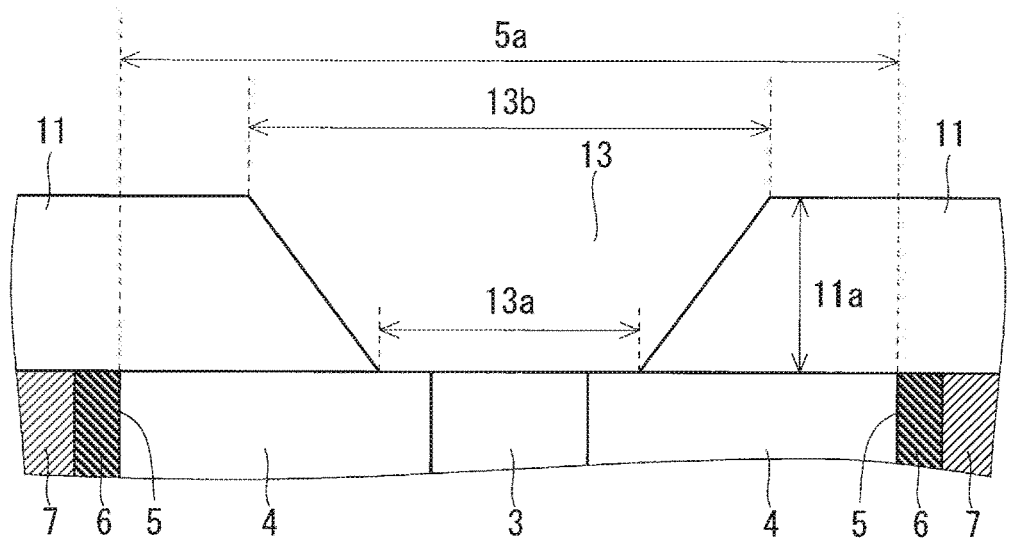
FIG. 5 is an enlarged partial view of the RC-IGBT according to the present invention.

The first electrode 31 is embedded in the contact hole 13 of the interlayer dielectric 11 without using the plug contact to achieve a favorable low-cost semiconductor device. Embeddability of the first electrode 31 in the contact hole 13 is affected by the thickness, the shape, and the opening dimensions of the interlayer dielectric 11. FIG. 5 is an enlarged view of a part of the interlayer dielectric 11 around the contact hole 13. When the contact hole 13 of the interlayer dielectric 11 illustrated in FIG. 5 has an opening width 13a at a lower surface of the interlayer dielectric 11 of 500 nm and an opening width 13b at an upper surface of the interlayer dielectric 11 of 800 nm, and the interlayer dielectric 11 has a thickness 11a of 500 nm, for example, the embeddability of the first electrode 31 in the contact hole 13 has no problem. A pitch width 5a that is the distance between two adjacent trenches 5 can be set in view of the dimensions of the contact hole 13 described above. When the contact hole 13 has the above-mentioned dimensions, for example, the pitch width 5a can be set to 2.4 μm.

No barrier metal is disposed in the diode region 104B. The p-type anode layer 21 is not connected to the barrier metal, and is in direct contact with the first electrode 31, so that low contact resistance can be obtained. An aluminum alloy is used as the first electrode 31, so that interdiffusion of an aluminum component and a silicon component between the first electrode 31 and the p-type anode layer 21 can be prevented. In a case where the dummy gate electrode 26 in the diode region 104B is covered with the interlayer dielectric 11 as with the gate electrode 7 in the transistor region 104A, the barrier metal 12 may be disposed on a surface of at least part of the interlayer dielectric 11 covering the dummy gate electrode 26. This is because the low contact resistance can be obtained unless the barrier metal 12 is connected to the p-type anode layer 21.

The first electrode 31 is disposed over the transistor region 104A and the diode region 104B. That is to say, the transistor region 104A and the diode region 104B share the first electrode 31 as an upper surface of the RC-IGBT 104. This eliminates the need to perform wire bonding and the like under different conditions in the transistor region 104A and in the diode region 104B in the assembly process of manufacturing a package using the RC-IGBT 104.

B-2. First Manufacturing Method

Figure 6:
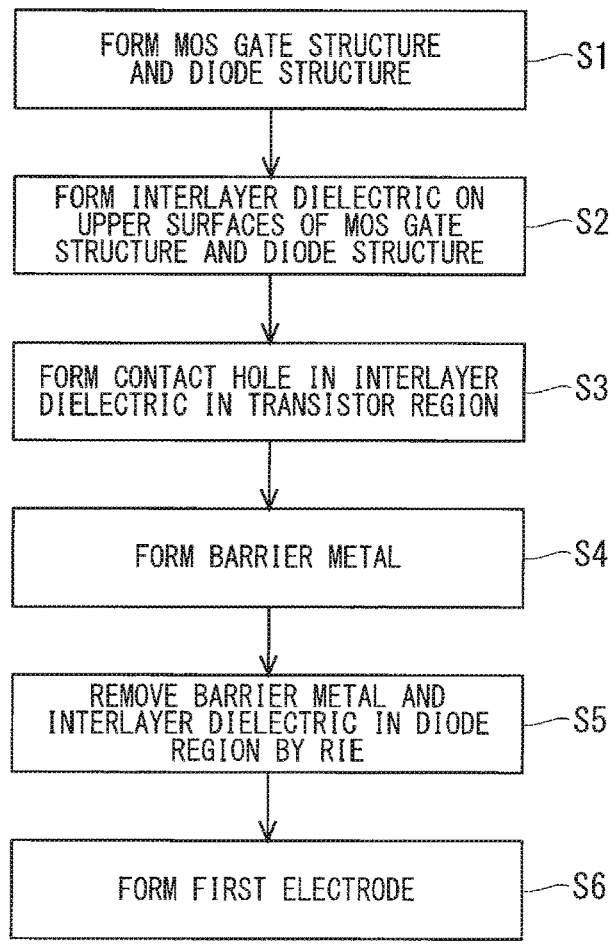
FIG. 6 is a flow chart showing a first method of manufacturing the RC-IGBT according to the present invention.
Figure 7:
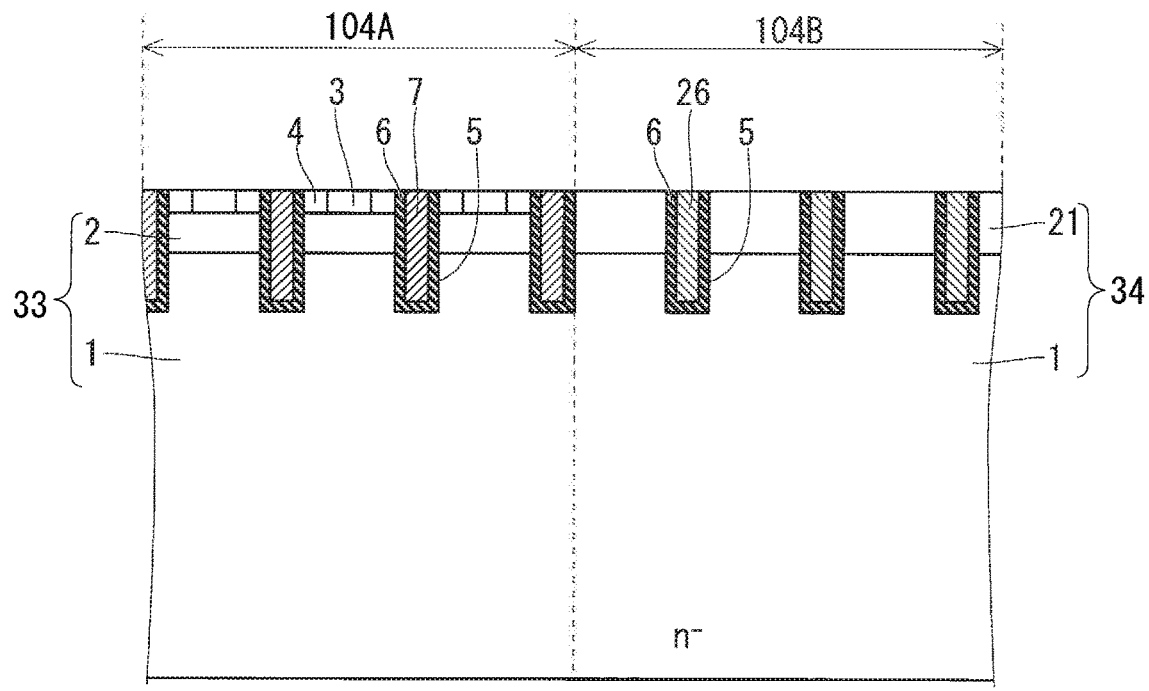
FIG. 7 is a sectional view for explaining the first method of manufacturing the RC-IGBT according to the present invention.
Figure 8:
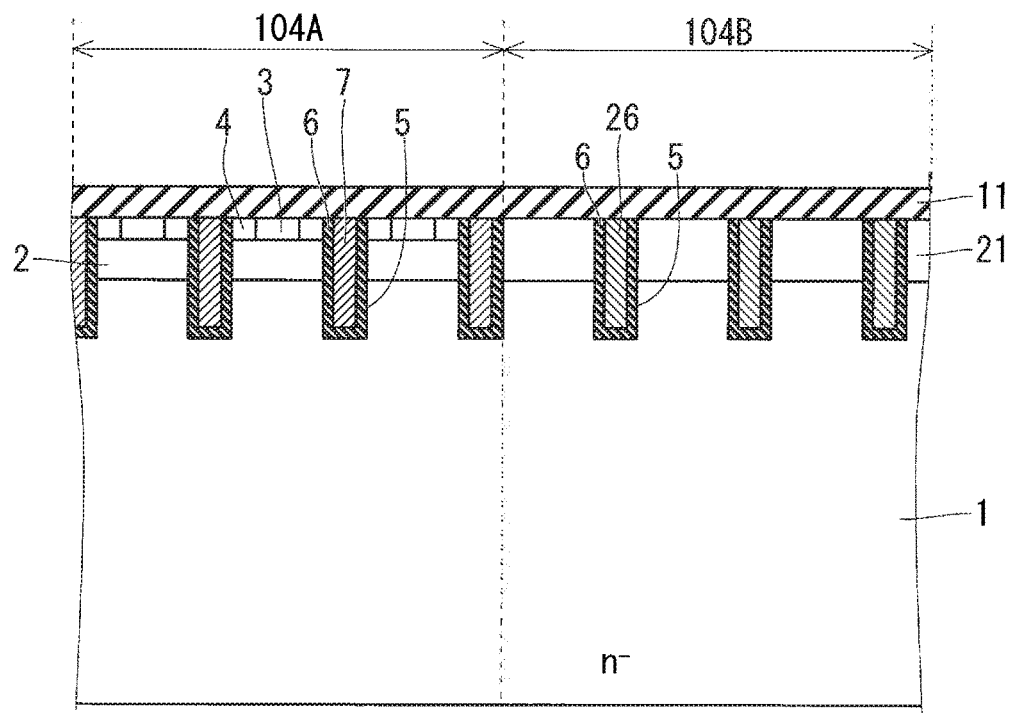
FIG. 8 is a sectional view for explaining the first method of manufacturing the RC-IGBT according to the present invention.
Figure 9:
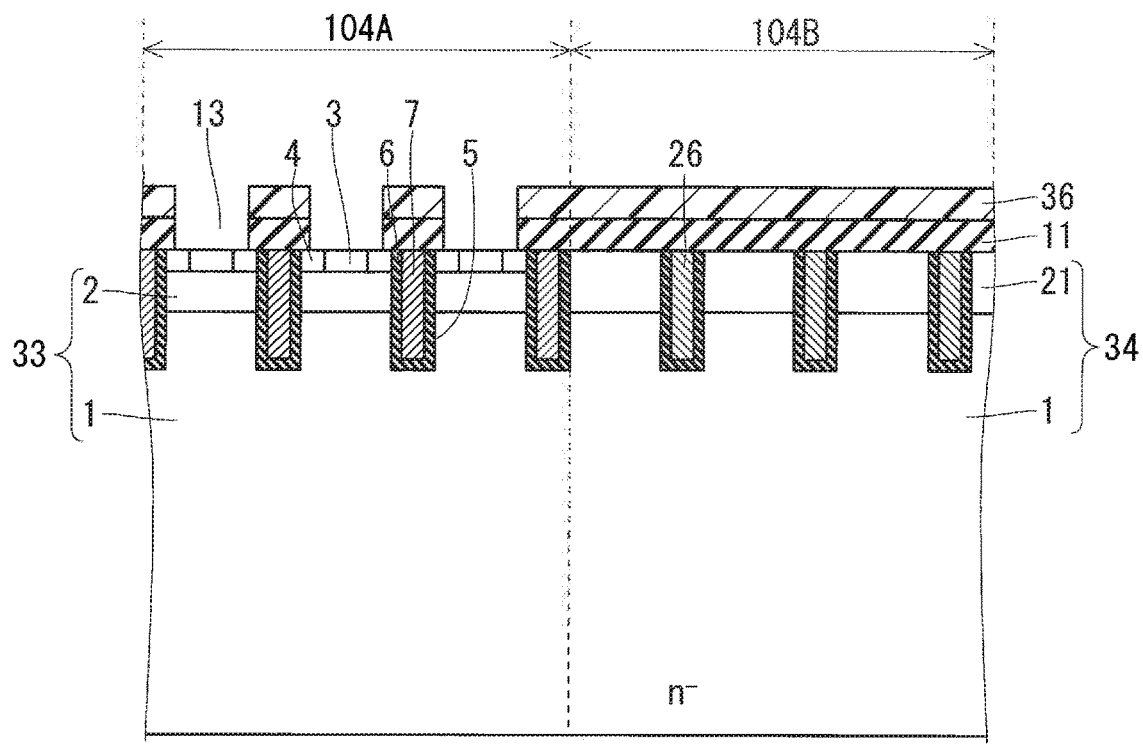
FIG. 9 is a sectional view for explaining the first method of manufacturing the RC-IGBT according to the present invention.
Figure 10:
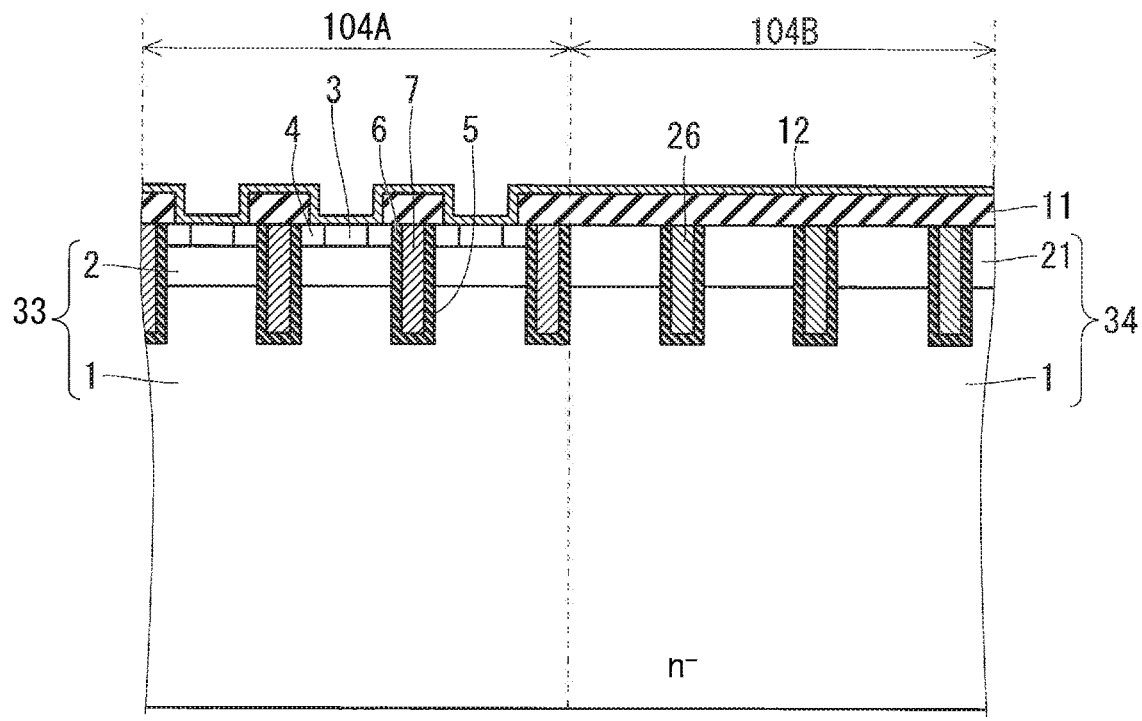
FIG. 10 is a sectional view for explaining the first method of manufacturing the RC-IGBT according to the present invention.
Figure 11:
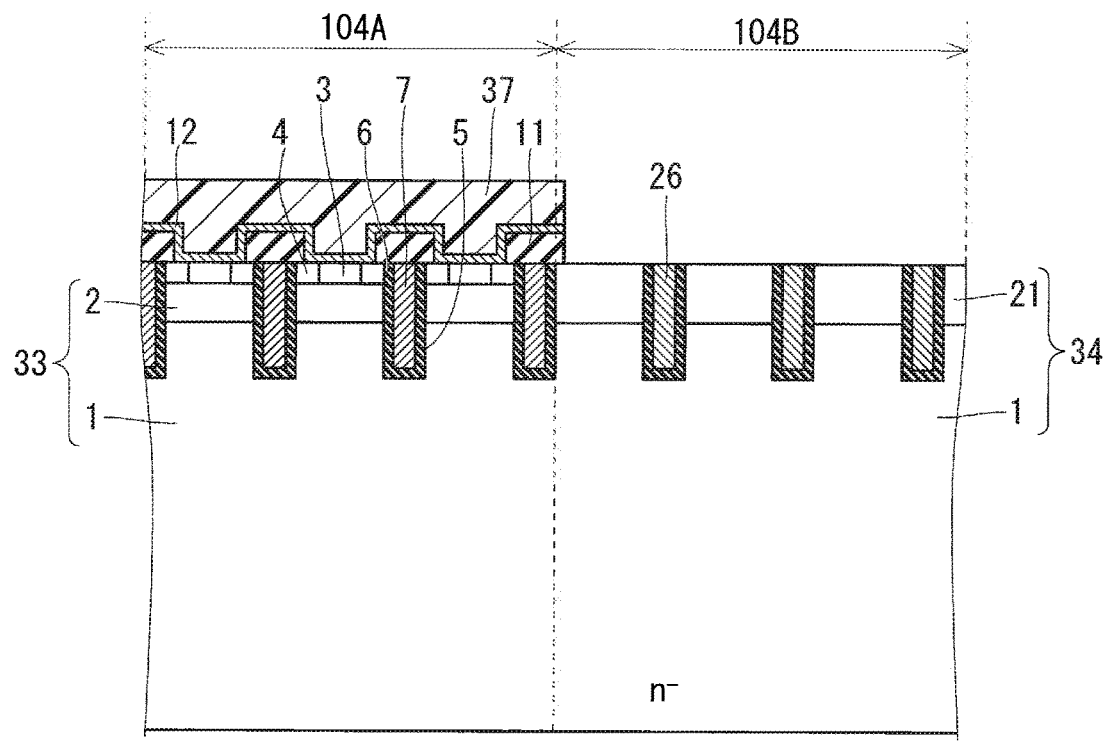
FIG. 11 is a sectional view for explaining the first method of manufacturing the RC-IGBT according to the present invention.
Figure 12:
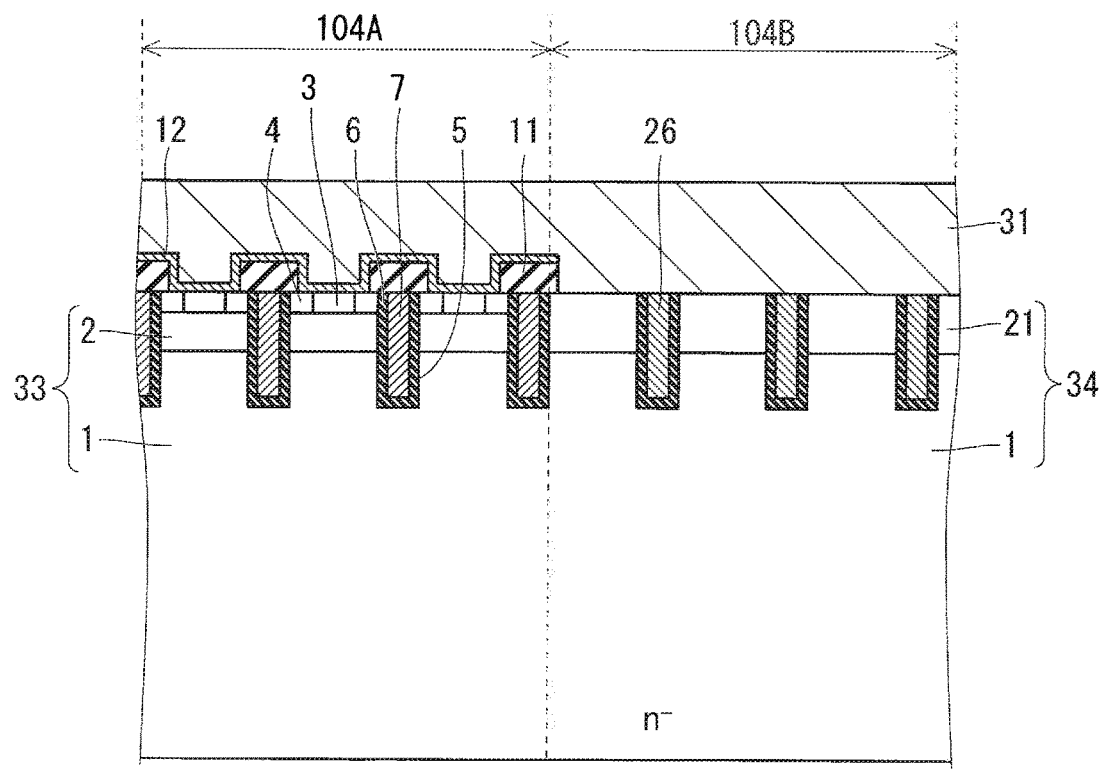
FIG. 12 is a sectional view for explaining the first method of manufacturing the RC-IGBT according to the present invention.

A first method of manufacturing the RC-IGBT 104 will be described next. FIG. 6 is a flow chart showing the process from formation of a surface element structure to formation of the first electrode 31 in the first method of manufacturing the RC-IGBT 104. FIGS. 7 to 12 are each a sectional view illustrating the RC-IGBT 104 during manufacture in the first manufacturing method.

First, the MOS gate structure 33 and the diode structure 34 are prepared (step S1). Specifically, in the transistor region 104A, the p-type base layer 2 is formed on the upper surface of the n−−-type drift layer 1, and the p+-type base layer 3 and the n+-type emitter layer 4 are selectively formed on the upper surface of the p-type base layer 2. Next, the trenches 5 are formed to penetrate, from the upper surface of the n+-type emitter layer 4, the n+-type emitter layer 4 and the p-type base layer 2. The gate dielectric 6 is formed on the inner wall of each of the trenches 5, and, further, the gate electrode 7 is embedded in each of the trenches 5. In the diode region 104B, the p-type anode layer 21 is formed on the upper surface of the n−−-type drift layer 1. The trenches 5 are then formed to penetrate the p-type anode layer 21 from an upper surface of the p-type anode layer 21. The gate dielectric 6 is formed on the inner wall of each of the trenches 5, and the dummy gate electrode 26 is embedded in each of the trenches 5. This completes the structure illustrated in FIG. 7.

Next, the interlayer dielectric 11 is formed on upper surfaces of the MOS gate structure 33 and the diode structure 34 (step S2). This yields the structure illustrated in FIG. 8.

Then, a resist mask 36 is formed on the interlayer dielectric 11 by photolithography. The resist mask 36 selectively has an opening on the interlayer dielectric 11 in the transistor region 104A. The contact hole 13 is formed in the interlayer dielectric 11 in the transistor region 104A using the resist mask 36 (step S3). For example, the contact hole 13 can be formed by reactive ion etching (RIE) using trifluoromethane ($CHF_3$), tetrafluoromethane ($CF_4$), or the like or by fluorine-based wet etching. This yields the structure illustrated in FIG. 9. The resist mask 36 is then removed.

Next, the barrier metal 12 is formed in the contact hole 13 and on the interlayer dielectric 11 over the transistor region 104A and the diode region 104B (step S4). The barrier metal 12 is deposited by sputtering, and includes the transition metal, such as titanium, as its main component. The barrier metal 12 is in contact with the p+-type base layer 3 or the n+-type emitter layer 4, which is a silicon-based layer exposed by the contact hole 13, to be silicided at the contact interface. The surface of the barrier metal 12 is nitrided by heat treatment in a nitrogen atmosphere after sputtering. This yields the structure illustrated in FIG. 10. This means that the barrier metal has a structure in which titanium silicide, titanium, and titanium nitride are stacked in the stated order.

Next, a resist mask 37 is formed in the transistor region 104A, and the barrier metal 12 and the interlayer dielectric 11 in the diode region 104B are removed using the resist mask 37 (step S5). The barrier metal 12 and the interlayer dielectric 11 in the diode region 104B are removed by dry etching, such as RIE, using trifluoromethane, tetrafluoromethane, or the like. Removing the interlayer dielectric 11 and the barrier metal 12 on the diode structure 34 at a time by dry etching allows for a low-cost process. This yields the structure illustrated in FIG. 11. The resist mask 37 is then removed.

Next, an aluminum alloy is deposited by sputtering over the transistor region 104A and the diode region 104B to form the first electrode 31 (step S6). In the transistor region 104A, the first electrode 31 is formed to enter the contact hole 13. This yields the structure illustrated in FIG. 12. Then, the structure on the lower surface of the n−−-type drift layer 1, namely, the n-type buffer layer 9, the p-type collector layer 10, the n+-type cathode layer 23, and the second electrode 32, is formed to complete the RC-IGBT 104 illustrated in FIG. 4.

B-3. Effects

The RC-IGBT 104 according to Embodiment 1 includes the semiconductor substrate 35 and the first electrode 31. The semiconductor substrate 35 has the first main surface 35A and the second main surface 35B, and includes the transistor region 104A forming a transistor extending from the first main surface 35A to the second main surface 35B and the diode region 104B forming a diode extending from the first main surface 35A to the second main surface 35B. The first electrode 31 is disposed on the first main surface 35A of the semiconductor substrate 35 over the transistor region 104A and the diode region 104B. The semiconductor substrate 35 includes the MOS gate structure 33 on the first main surface 35A side in the transistor region 104A. The RC-IGBT 104 includes the interlayer dielectric 11 and the barrier metal 12. The interlayer dielectric 11 covers the gate electrode 7 of the MOS gate structure 33, and has the contact hole 13 exposing the semiconductor layer of the MOS gate structure 33. The barrier metal 12 is disposed in the contact hole 13. The first electrode 31 enters the contact hole 13, is in contact with the semiconductor layer of the MOS gate structure 33 through the barrier metal 12 in the contact hole 13, and is in direct contact with the semiconductor layer in the diode region 104B of the semiconductor substrate 35.

According to the above-mentioned configuration, the semiconductor layer of the MOS gate structure 33 is in contact with the barrier metal 12, so that the contact resistance is lower than that in a case where the semiconductor layer of the MOS gate structure 33 is in direct contact with the first electrode 31. Interdiffusion of a metal material for the first electrode 31, such as Al, and a material for the semiconductor layer, such as Si, can be reduced. The p-type anode layer 21, which is the semiconductor layer in the diode region 104B, is in direct contact with the first electrode 31, so that the contact resistance can be low even when the p-type anode layer does not have a high concentration. The absence of the p-type anode layer having a high concentration can avoid delay in discharge of carriers in the off state. The first electrode is shared between the transistor region 104A and the diode region 104B, and thus the same condition on wire bonding, solder wettability, or the like can be used in the transistor region 104A and in the diode region 104B in the assembly process using the RC-IGBT 104. As the first electrode 31 enters the contact hole 13, and is in contact with the semiconductor layer of the MOS gate structure 33, there is no need to use an expensive contact plug, such as a tungsten plug, and the manufacturing cost of the RC-IGBT 104 can be reduced.

The first method of manufacturing the RC-IGBT 104 includes the steps of: (a) forming the MOS gate structure 33 and the diode structure 34 on the first main surface 35A side of the semiconductor substrate 35; (b) forming the interlayer dielectric 11 on the MOS gate structure 33 and the diode structure 34; (c) opening the contact hole 13 exposing the semiconductor layer of the MOS gate structure 33 in the interlayer dielectric 11 on the MOS gate structure 33; (d) forming the barrier metal 12 on the semiconductor layer in the contact hole 13 and on the interlayer dielectric 11; (e) removing the interlayer dielectric 11 and the barrier metal 12 on the diode structure 34; and (f) forming the first electrode 31 in the contact hole 13 and on the diode structure 34. According to this manufacturing method, the RC-IGBT 104 can be manufactured without connecting any unnecessary electrode layer to the p-type anode layer 21.

C. Embodiment 2

C-1. Second Manufacturing Method

Figure 13:
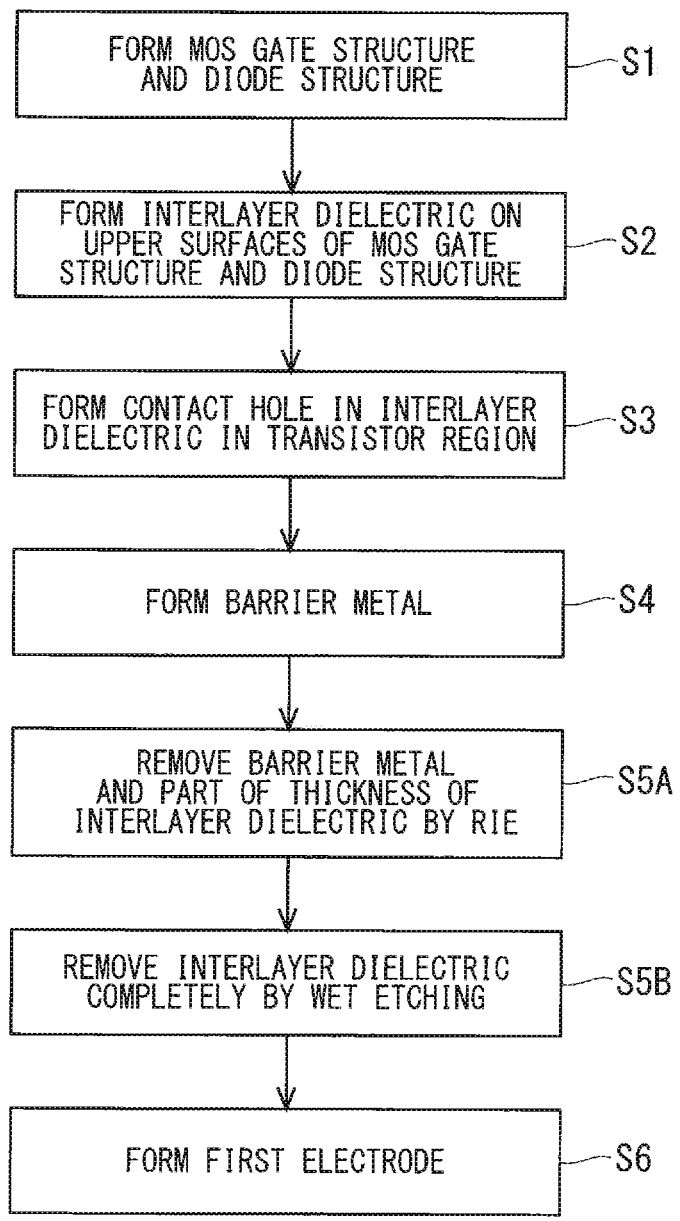
FIG. 13 is a flow chart showing a second method of manufacturing the RC-IGBT according to the present invention.

A second method of manufacturing the RC-IGBT 104 will be described in Embodiment 2. FIG. 13 is a flow chart showing the second method of manufacturing the RC-IGBT 104. As shown in FIG. 13, steps S1 to S4 and S6 in the second manufacturing method are similar to those in the first manufacturing method shown in FIG. 6, and the second manufacturing method differs from the first manufacturing method only in that steps S5A and S5B are performed in place of step S5 of FIG. 6. This means that the second manufacturing method differs from the first manufacturing method in a method of removing, after formation of the barrier metal 12 over the IGBT region 104A and the diode region 104B, the barrier metal 12 from the diode region 104B.

Figure 14:
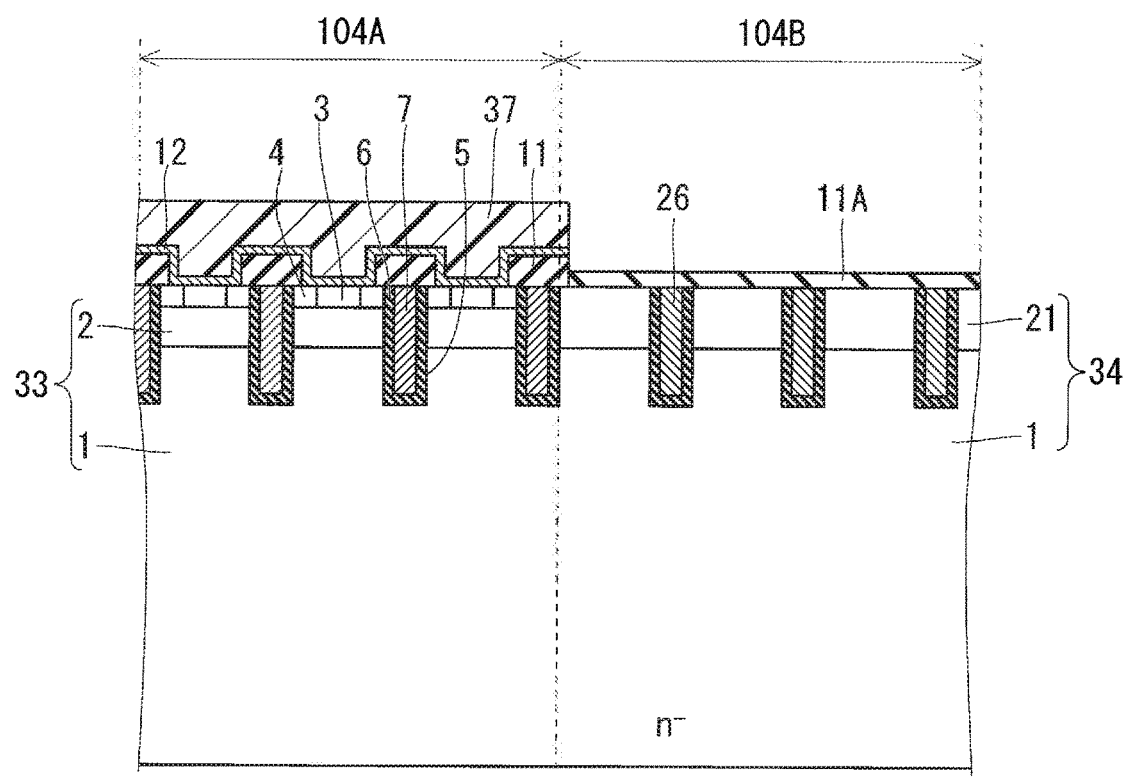
FIG. 14 is a sectional view for explaining the second method of manufacturing the RC-IGBT according to the present invention.

Description on steps S1 to S4 of FIG. 13 is omitted as steps S1 to S4 are similar to those in the first manufacturing method. After step S4, the resist mask 37 is formed in the IGBT region 104A, and the barrier metal 12 and the interlayer dielectric 11 in the diode region 104B are removed using the resist mask 37 (step S5A). Although the interlayer dielectric 11 in the diode region 104B is completely removed by dry etching, such as RIE, in the first manufacturing method, a part of the thickness of the interlayer dielectric 11 is left so that the p-type anode layer 21 is not exposed in the second manufacturing method. In FIG. 14, the part of the interlayer dielectric left in step S5A is shown as an interlayer dielectric 11A. The interlayer dielectric 11 is partially removed by dry etching, such as RIE, using trifluoromethane, tetrafluoromethane, or the like. The thickness of the interlayer dielectric 11A is not particularly limited.

Figure 15:
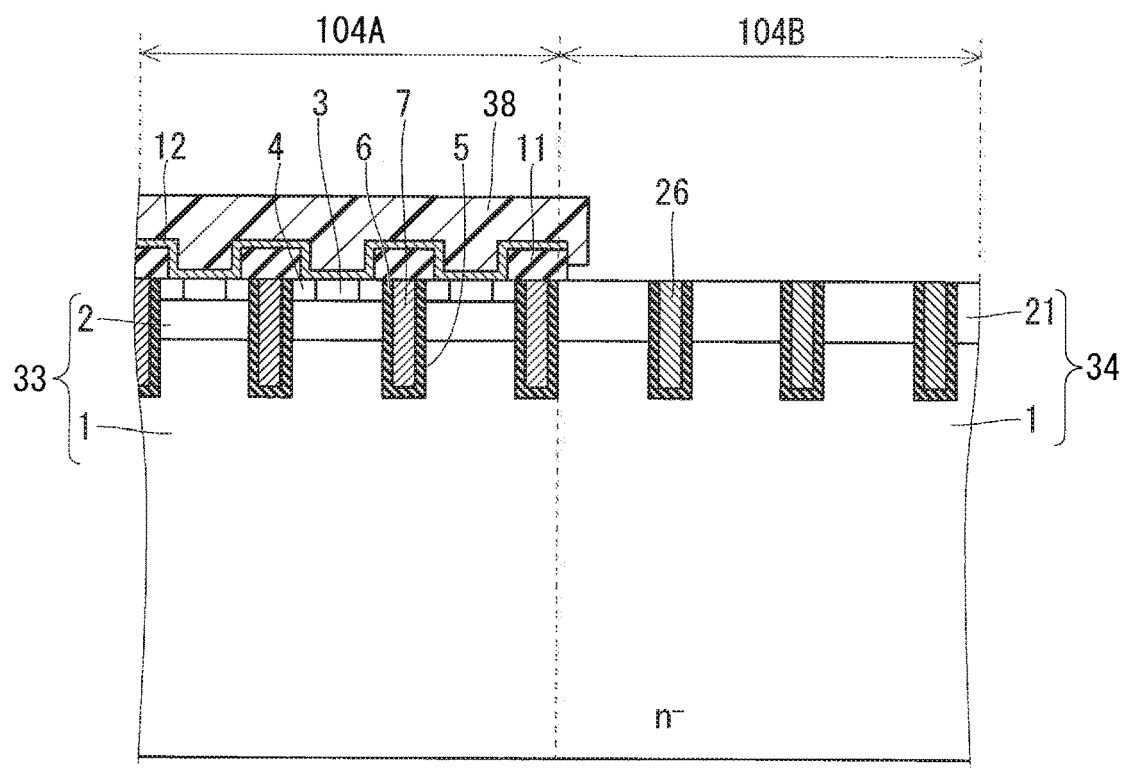
FIG. 15 is a sectional view for explaining the second method of manufacturing the RC-IGBT according to the present invention.

Next, the resist mask 37 is removed, and a new resist mask 38 is formed. The resist mask 38 also has an opening in the diode region 104B as with the resist mask 37, but the opening is slightly smaller than the opening of the resist mask 37, as illustrated in FIG. 15. That is to say, the resist mask 38 overlaps the end of the diode region 104B.

Next, the interlayer dielectric 11A is completely removed by wet etching using the resist mask 38 (step S5B). For example, fluorine-based wet etching is herein used. When the interlayer dielectric 11A is removed to expose the p-type anode layer 21, damage to the p-type anode layer 21 can be reduced by using not the dry etching but the wet etching. Although an etch rate of the barrier metal 12 is high, and the amount of side etching is large in wet etching, the barrier metal 12 in the IGBT region 104A is not removed by side etching as the resist mask 38 overlaps the end of the diode region 104B as described above.

Figure 16:
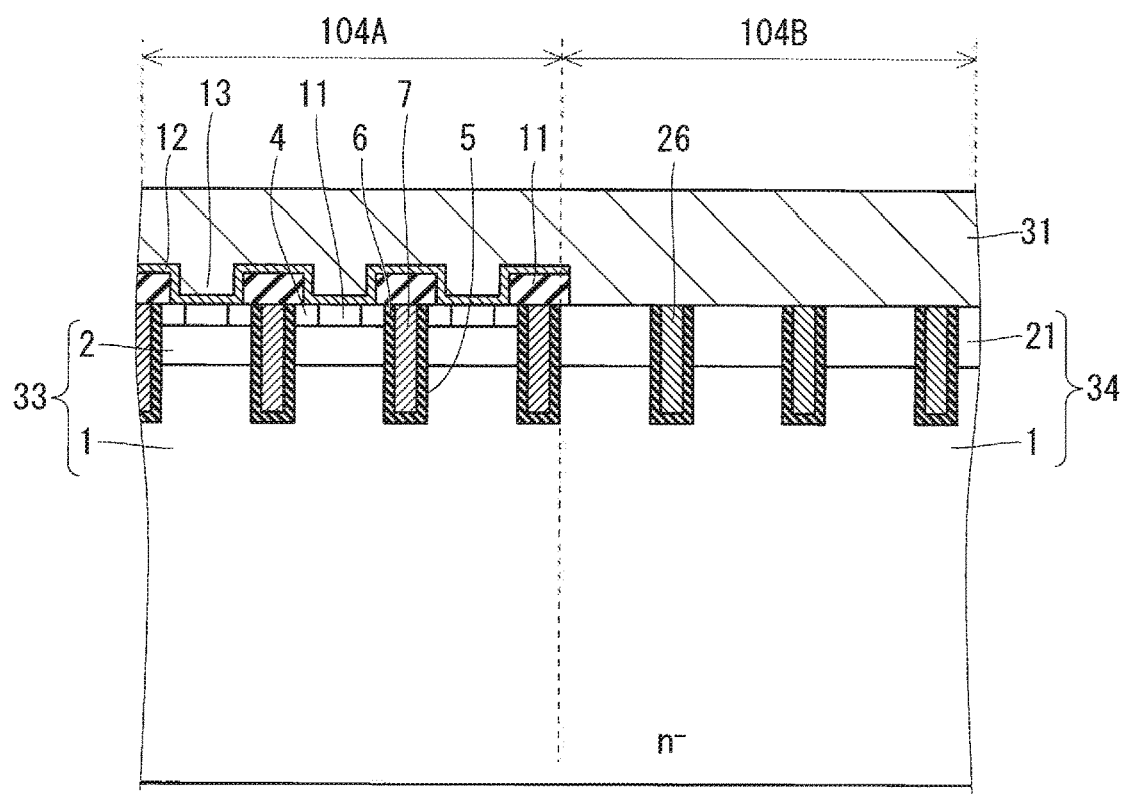
FIG. 16 is a sectional view for explaining the second method of manufacturing the RC-IGBT according to the present invention.

Next, an aluminum alloy is deposited by sputtering over the IGBT region 104A and the diode region 104B to form the first electrode 31 (step S6). This yields the structure illustrated in FIG. 16. Then, the structure on the lower surface of the n--type drift layer 1, namely, the n-type buffer layer 9, the p-type collector layer 10, the n+-type cathode layer 23, and the second electrode 32, is formed to complete the RC-IGBT 104 illustrated in FIG. 4.

C. Effects

The second method of manufacturing the RC-IGBT 104 includes the steps of: (a) forming the MOS gate structure 33 and the diode structure 34 on the first main surface 35A side of the semiconductor substrate 35; (b) forming the interlayer dielectric 11 on the MOS gate structure 33 and the diode structure 34; (c) opening the contact hole 13 exposing the semiconductor layer of the MOS gate structure 33 in the interlayer dielectric 11 on the MOS gate structure 33; (d) forming the barrier metal 12 on the semiconductor layer in the contact hole 13 and on the interlayer dielectric 11; (e) removing the interlayer dielectric 11 and the barrier metal 12 on the diode structure 34; and (f) forming the first electrode 31 on the diode structure 34, and the step (e) includes the steps of: (e1) removing the barrier metal 12 and a part of the thickness of the interlayer dielectric 11 on the diode structure 34 by dry etching; and (e2) removing the interlayer dielectric 11 on the diode structure 34 left in the step (e1) by wet etching. As described above, by using not the dry etching but the wet etching in the etching process of removing the barrier metal 12 in the diode region 104B to expose the p-type anode layer 21, the damage to the p-type anode layer 21 caused by etching can be reduced.

D. Embodiment 3

In the present embodiment, the RC-IGBT 104 described in Embodiments 1 and 2 is applied to a power conversion apparatus. The present invention is not limited to a specific power conversion apparatus, but a case where the present invention is applied to a three-phase inverter will be described below as Embodiment 3.

Figure 17:
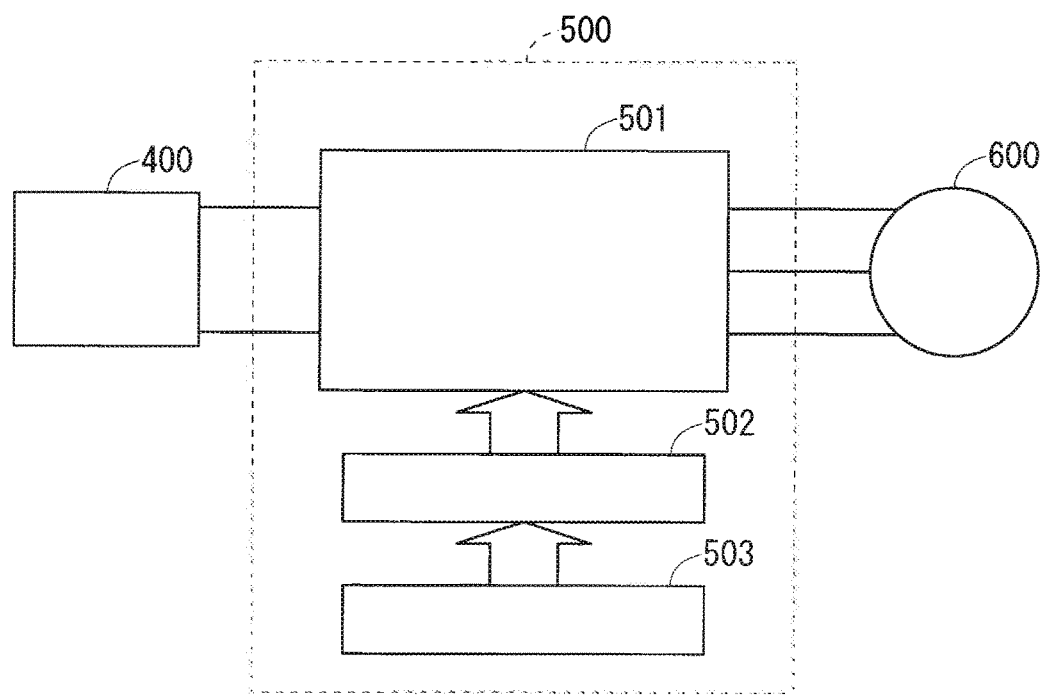
FIG. 17 is a block diagram showing the configuration of a power conversion system to which a power conversion apparatus according to the present invention is applied.

FIG. 17 is a block diagram showing the configuration of a power conversion system to which the power conversion apparatus according to the present invention has been applied.

The power conversion system shown in FIG. 17 includes a power supply 400, a power conversion apparatus 500, and a load 600. The power supply 400 is a DC power supply, and supplies DC power to the power conversion apparatus 500. The power supply 400 may be in various forms, and, for example, may be a DC system, a solar cell, and a storage cell, or may be a rectifier circuit connected to an AC system and an AC/DC converter. The power supply 400 may be a DC/DC converter that converts DC power output from the DC system into predetermined power.

The power conversion apparatus 500 is a three-phase inverter connecting the power supply 400 and the load 600, and converts DC power supplied from the power supply 400 into AC power, and supplies the AC power to the load 600. As shown in FIG. 17, the power conversion apparatus 500 includes a main conversion circuit 501 that converts DC power into AC power for output, a drive circuit 502 that outputs a drive signal for driving each switching element of the main conversion circuit 501, and a control circuit 503 that outputs a control signal for controlling the drive circuit 502 to the drive circuit 502.

The load 600 is a three-phase motor driven by the AC power supplied from the power conversion apparatus 500. The load 600 is not limited to a specific application and is a motor mounted on various types of electric equipment, and is used, for example, as a motor for a hybrid vehicle, an electric vehicle, a railway vehicle, an elevator, or air-conditioning equipment.

The power conversion apparatus 500 will be described in details below. The main conversion circuit 501 includes a switching element and a freewheeling diode (not illustrated), and converts the DC power supplied from the power supply 400 into the AC power upon switching of the switching element, and supplies the AC power to the load 600. The main conversion circuit 501 may have various types of specific circuit configuration, but the main conversion circuit 501 according to the present embodiment is a two-level three-phase full-bridge circuit, and includes six switching elements and six freewheeling diodes anti-parallel connected to the respective switching elements. The RC-IGBT 104 described in Embodiments 1 and 2 is applied to each of the switching elements and the freewheeling diodes of the main conversion circuit 501. Every two switching elements out of the six switching elements are connected in series to form vertical arms, and the vertical arms form respective phases (a U phase, a V phase, and a W phase) of the full-bridge circuit. Output terminals of the respective vertical arms, that is, three output terminals of the main conversion circuit 501, are connected to the load 600.

The drive circuit 502 generates the drive signal for driving each switching element of the main conversion circuit 501, and supplies the drive signal to a control electrode of each switching element of the main conversion circuit 501. Specifically, the drive circuit 502 outputs a drive signal for switching each switching element to an on state and a drive signal for switching each switching element to an off state to the control electrode of each switching element in accordance with the control signal from the control circuit 503, which will be described below. In a case where each switching element is maintained in the on state, the drive signal is a voltage signal (an on signal) equal to or higher than a threshold voltage of the switching element, and, in a case where the switching element is maintained in the off state, the drive signal is a voltage signal (an off signal) equal to or lower than the threshold voltage of the switching element.

The control circuit 503 controls each switching element of the main conversion circuit 501 so that desired power is supplied to the load 600. Specifically, the control circuit 503 calculates time (on time) during which each switching element of the main conversion circuit 501 is to be in the on state, based on power to be supplied to the load 600. For example, the control circuit 503 can control the main conversion circuit 501 by PWM control of modulating the on time of each switching element in accordance with a voltage to be output. The control circuit 503 outputs a control command (control signal) to the drive circuit 502 so that the on signal is output to a switching element to be in the on state, and the off signal is output to a switching element to be in the off state at each point of time. The drive circuit 502 outputs, as the drive signal, the on signal or the off signal to the control electrode of each switching element in accordance with the control signal.

In the power conversion apparatus according to the present embodiment, the RC-IGBT 104 described in Embodiments 1 and 2 is applied to each switching element of the main conversion circuit 501, and thus favorable diode characteristics and low cost can be achieved.

Although an example in which the present invention is applied to the two-level three-phase inverter is described in the present embodiment, the present invention is not limited to this example, and is applicable to various power conversion apparatuses. Although the power conversion apparatus in the present embodiment is the two-level power conversion apparatus, the power conversion apparatus may be a three-level or multi-level power conversion apparatus, and the present invention may be applied to a single-phase inverter in a case where power is supplied to a single-phase load. The present invention is applicable to the DC/DC converter or the AC/DC converter in a case where power is supplied to a DC load and the like.

The power conversion apparatus to which the present invention is applied is not limited to that in a case where the above-mentioned load is the motor, and may be used as a power supply apparatus for a discharge processing machine, a laser processing machine, an induction cooker, or a contactless power supply system, and may further be used as a power conditioner for a photovoltaic system, a storage system, and the like, for example.

Embodiments of the present invention can freely be combined with each other, and can be modified or omitted as appropriate within the scope of the invention.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device manufacturing method, comprising performing, in this order, the steps of:
    (a) forming a MOS gate structure and a diode structure on a first main surface side of a semiconductor substrate;
    (b) forming an interlayer dielectric on said MOS gate structure and said diode structure;
    (c) opening a contact hole in said interlayer dielectric on said MOS gate structure, said contact hole exposing a semiconductor layer of said MOS gate structure;
    (d) forming a barrier metal on said semiconductor layer in said contact hole and on said interlayer dielectric;
    (e) removing said interlayer dielectric and said barrier metal on said diode structure; and
    (f) forming a first electrode in said contact hole and on said diode structure;
    wherein no barrier metal is disposed on said first main surface side of said semiconductor substrate over said diode structure; and
    wherein said barrier metal including at least one of titanium nitride, titanium carbide, and titanium silicide.

2. The semiconductor device manufacturing method according to claim 1, wherein
    said step (e) is a step of removing said interlayer dielectric and said barrier metal on said diode structure by dry etching.

3. The semiconductor device manufacturing method according to claim 1, wherein
    said step (e) includes the steps of:
    (e1) removing said barrier metal and a part of a thickness of said interlayer dielectric on said diode structure by dry etching; and
    (e2) removing said interlayer dielectric on said diode structure left in said step (e1) by wet etching.

* * * * *